United States Patent
Kitagaki

(10) Patent No.: US 10,228,397 B2
(45) Date of Patent: Mar. 12, 2019

(54) APPARATUS AND ASSOCIATED METHODS FOR MONITORING NOISE LEVEL OF A SIGNAL

(71) Applicant: Keysight Technologies, Inc., Minneapolis, MN (US)

(72) Inventor: Takashi Kitagaki, Tokyo (JP)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 14/947,942

(22) Filed: Nov. 20, 2015

(65) Prior Publication Data

US 2017/0146573 A1 May 25, 2017

(51) Int. Cl.

| | |
|---|---|
| G01R 33/02 | (2006.01) |
| H03M 1/06 | (2006.01) |
| H03M 1/10 | (2006.01) |
| H03M 1/12 | (2006.01) |
| G01R 19/00 | (2006.01) |
| G01R 23/20 | (2006.01) |
| G01R 15/00 | (2006.01) |
| G01R 13/00 | (2006.01) |

(52) U.S. Cl.
CPC ..... *G01R 19/0007* (2013.01); *G01R 19/0053* (2013.01); *G01R 19/0092* (2013.01); *G01R 23/20* (2013.01); *G01R 13/00* (2013.01); *G01R 15/005* (2013.01)

(58) Field of Classification Search
CPC .......... G01R 33/02; G01S 7/292; G01S 7/34; H04L 27/08; H03M 1/06; H03M 1/10; H03M 1/12

USPC ................. 324/114, 239–258, 260; 341/120; 375/345

See application file for complete search history.

(56) References Cited

U.S. PATENT DOCUMENTS

| | | | | |
|---|---|---|---|---|
| 5,072,415 A | * | 12/1991 | Cannelli | G01H 3/14 181/0.5 |
| 5,798,728 A | * | 8/1998 | Tomishima | G01S 7/2927 342/93 |
| 6,028,729 A | * | 2/2000 | Nakasa | G03B 17/24 360/62 |
| 6,239,596 B1 | * | 5/2001 | Stupak, Jr. | G01R 33/028 324/258 |

(Continued)

OTHER PUBLICATIONS

Keysight Technologies, B2980A SeriesFemto/Picoammeter and Electrometer/High Resistance Meter, product Sep. 1, 2014. datasheet, Sep. 1, 2014.

(Continued)

*Primary Examiner* — Neel Shah

(57) ABSTRACT

A measuring apparatus is provided for electrical signals. The measuring apparatus includes an analog-to-digital (A/D) converter configured to A/D-convert an analog signal to be measured, and an integrator configured to perform integration time processing for a plurality of digital values output from the A/D converter based on an integration time. The integrator is configured to output a plurality of measured values obtained by the integration time processing. A noise level calculation unit is configured to calculate a noise level of the analog signal to be measured from the plurality of measured values obtained by the integration time processing, and a display unit is configured to display noise levels corresponding to a plurality of integration times.

19 Claims, 11 Drawing Sheets

(56) References Cited

U.S. PATENT DOCUMENTS

| | | | |
|---|---|---|---|
| 6,559,782 B2 | 5/2003 | Hiramatsu et al. | |
| 6,911,831 B2 | 6/2005 | Tsutsui | |
| 7,714,268 B2 | 5/2010 | Leijssen et al. | |
| 8,278,909 B2 | 10/2012 | Fletcher | |
| 2009/0154617 A1* | 6/2009 | Jung | H04L 27/2662 |
| | | | 375/345 |
| 2015/0226849 A1* | 8/2015 | Matsuda | G01S 13/95 |
| | | | 702/3 |

OTHER PUBLICATIONS

Agilent Technologies, 3458A Multimeter User's Guide, 2012.
Agilent Technologies, "Ultra Low Current DC Characterization at the Wafer Level", Application Note 4070-01, Part No. 5965-7352E, Jul. 1, 2000.

* cited by examiner

APPARATUS AND ASSOCIATED METHODS FOR MONITORING NOISE LEVEL OF A SIGNAL

BACKGROUND

It is difficult to measure a micro-signal of a micro-current or the like. This is because a signal to be measured, which is extremely small, is subject to influence of extrinsic noise. In other words, the signal is subject to the influence of noise due to a low signal-to-noise (S/N) ratio at a time of measurement. In addition, it is known that the influence of noise can be suppressed by restricting a frequency bandwidth by increasing an integration time (aperture time) for a measuring instrument when the signal to be measured is a direct current or when a frequency component thereof is sufficiently low. However, the measurement time becomes longer as the integration time is increased due to a trade-off therebetween, which raises a problem in that it is necessary to appropriately select the integration time.

To measure a signal on which a given amount of noise is superposed, an observer needs to adjust the integration time while checking a measurement result because it is difficult to know what length of time is appropriate as the integration time. Therefore, it is necessary to undertake a process of trial and error until a desired or optimum integration time is found. This work may require expert skills, and it may be difficult for the untrained.

For example, U.S. Pat. No. 6,559,782 discusses that the integration time may be set in terms of a multiple of a power line cycle (PLC).

Also, with reference to FIG. 10 herein, the setting of an integration time by taking a screen display for measurement results of a known digital multimeter, as an example, will be described. FIG. 10 illustrates an indication 1002 of a direct current measurement using the known multimeter, in which "+80.034 nA" or "+80.035 nA" is displayed to indicate real-time measurement results, and a least significant digit 1004 of a measured value whose indication exhibits variations, in which "4" and "5" are alternately displayed. The variations may be extended to the least significant two or three digits depending on the relationship between a signal to be measured and the integration time.

The above-mentioned case is interpreted to be a state in which the indication varies due to a short integration time, and the user may use Number of Power Line Cycles (NPLC) command or an aperture (APER) command to set an appropriate integration time so that the variations in the indication fall within a desired range.

However, in regard to an optimum range of the variations in the indication, the indication illustrated in FIG. 10 is not intuitive, which causes a difference in selection of the integration time to be set depending on the user's level of skill.

There is also known an apparatus disclosed in U.S. Pat. No. 6,911,831 for automatically switching a measuring range to an appropriate one in accordance with a magnitude of the signal to be measured which contains noise. However, there is no apparatus for extracting a noise component and presenting the user with an index of an appropriate integration time.

It may be desired to provide information useful for selection of an appropriate measurement condition (integration time) at a time of measuring a signal having a low S/N ratio such as a micro-current measurement.

SUMMARY

The present embodiments provide information useful for selection of an appropriate measurement condition (integration time) at a time of measuring a signal having a low S/N ratio such as a micro-current measurement. Also, the present embodiments may automatically select an appropriate integration time. As a result, even without expert skills, it may be possible to easily perform a difficult micro-current measurement.

The present embodiments may provide a function of facilitating determination of the integration time for the signal so that the S/N ratio has a desired value.

It may be an object of the present embodiments to provide a measuring apparatus and method, which allow a user to easily determine whether or not a given integration time is appropriate by assuming that variations of a signal to be measured based on the given integration time within a predetermined period are ascribable to noise, and displaying a noise level thereof simultaneously with a measured value.

It may be another object of the present embodiments to provide a measuring apparatus and method, which allow a user to more easily determine which integration time is to be set to obtain an appropriate noise level for a measured value by displaying a frequency distribution of the noise level over a plurality of integration times within a predetermined range In accordance with a representative embodiment, a measuring apparatus is provided for electrical signals. The measuring apparatus includes an analog-to-digital (A/D) converter configured to A/D-convert an analog signal to be measured, an integrator configured to perform integration time processing for a plurality of digital values output from the A/D converter based on an integration time, and configured to output a plurality of measured values obtained by the integration time processing, a noise level calculation unit configured to calculate a noise level of the analog signal to be measured from the plurality of measured values obtained by the integration time processing, and a display unit for displaying noise levels corresponding to a plurality of integration times.

In certain embodiments, a sequence control unit may be configured to supply the integrator with an integration time, supply the noise level calculation unit with a data count for calculation, and control the calculation of noise levels corresponding to the plurality of integration times, and a memory may be configured to store data output from the integrator and the noise level calculation unit, and to output the data to the display unit.

In various embodiments, the noise level calculation unit is configured to perform a statistical calculation for the plurality of measured values obtained by the integration time processing. The noise level calculation unit may be configured to calculate a variance of the plurality of measured values obtained by the integration time processing, and set the variance as the noise level.

In certain embodiments, the display unit is configured to display the noise levels corresponding to the plurality of integration times as a graph display, and display the noise levels of the graph display logarithmically. The display unit may be configured to display the noise levels corresponding to the plurality of integration times as a graph display, and display the integration times of the graph display logarithmically. The display unit may be further configured to display a present measured value obtained by the integration time processing of the plurality of measured values obtained by the integration time processing. The display unit may be further configured to display a present integration time. The display unit may be configured to digitally display the measured values obtained by the integration time processing including a highlighted unstable digit.

Another embodiment is directed to a measuring apparatus for electrical signals, the measuring apparatus including an analog-to-digital (A/D) converter configured to A/D-convert an analog signal to be measured, an integrator configured to perform integration time processing for a plurality of digital values output from the A/D converter based on an integration time, and configured to output a plurality of measured values obtained by the integration time processing, a noise level calculation unit configured to calculate a noise level of the analog signal to be measured from the plurality of measured values obtained by the integration time processing, and a display unit configured to display the plurality of measured values obtained by the integration time processing and the noise level.

Another embodiment is directed to a method of measuring a noise level of an analog signal. The method includes analog-to-digital (A/D) converting the analog signal to generate a plurality of digital values, performing integration time processing for the plurality of digital values based on an integration time, and generating a plurality of measured values obtained by the integration time processing, calculating a noise level of the analog signal from the plurality of measured values obtained by the integration time processing, and displaying the noise level and at least one of the plurality of measured values obtained by the integration time processing on a display unit.

In certain embodiments, calculating of the noise level comprises calculating a variance of the plurality of measured values obtained by the integration time processing to obtain the noise level.

In certain embodiments, the method may include supplying a plurality of integration times for the integration time processing, and obtaining the noise level corresponding to each of the plurality of integration times, wherein displaying the noise level and the at least one of the plurality of measured values obtained by the integration time processing comprises displaying the noise level corresponding to each of the plurality of integration times.

In certain embodiments, the noise levels corresponding to the plurality of integration times are displayed logarithmically as a graph display. Also, the noise levels corresponding to the plurality of integration times may be displayed as a graph display, and the integration times of the graph display are displayed logarithmically. Further, displaying may further include displaying a present measured value obtained by the integration time processing of the plurality of measured values obtained by the integration time processing.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
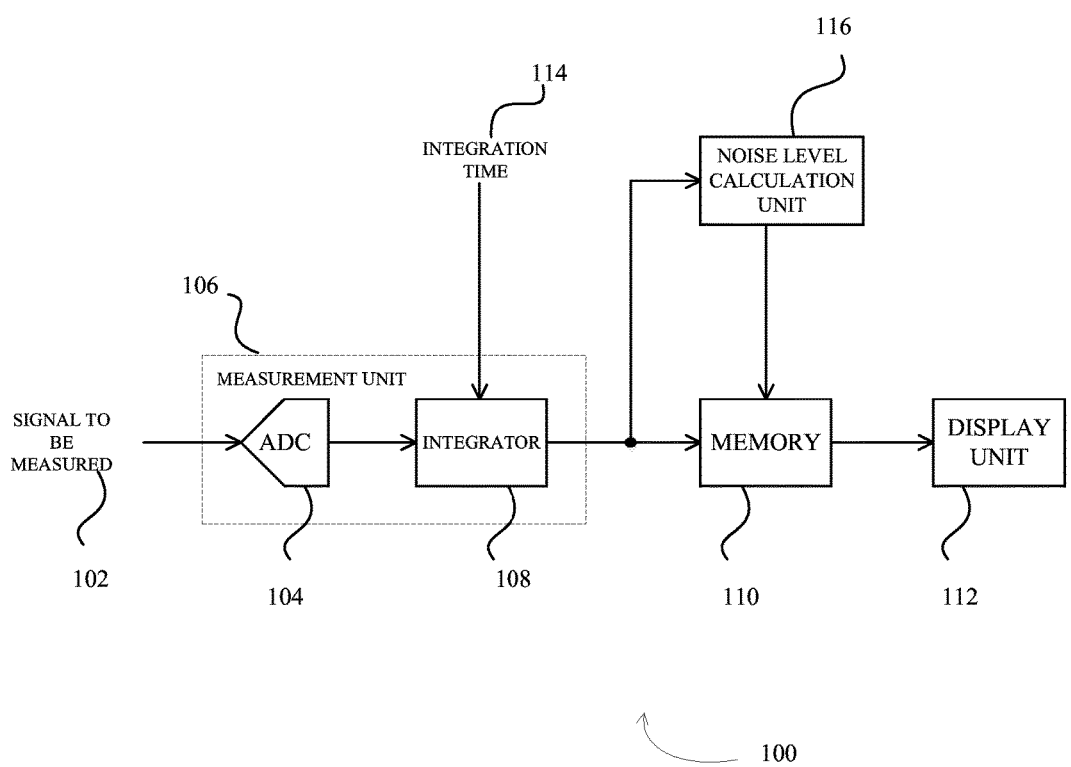
FIG. 1 is a block diagram of a measuring apparatus in accordance with features of a first embodiment.

In the following detailed description, for purposes of explanation and not limitation, example embodiments disclosing specific details are set forth in order to provide a thorough understanding of an embodiment according to the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

Relative terms may be used to describe the various elements' relationships to one another, as illustrated in the accompanying drawings. These relative terms are intended to encompass different orientations of the device and/or elements in addition to the orientation depicted in the drawings.

It will be understood that when an element is referred to as being "connected to" or "coupled to" another element, it can be directly connected or coupled, or intervening elements may be present.

'Computer memory' or 'memory' is an example of a computer-readable storage medium. Computer memory is any memory which is directly accessible to a processor. Examples of computer memory include, but are not limited to: RAM memory, registers, and register files. References to 'computer memory' or 'memory' should be interpreted as possibly being multiple memories. The memory may for instance be multiple memories within the same computer system. The memory may also be multiple memories distributed amongst multiple computer systems or computing devices.

A 'processor' as used herein encompasses an electronic component which is able to execute a program or machine executable instruction. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. Many programs have their instructions performed by multiple processors that may be within the same computing device or which may even be distributed across multiple computing devices.

A 'user interface' as used herein is an interface which allows a user or operator to interact with a computer or computer system. A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer to indicate the effects of the operator's control or manipulation. The display of data or information on a display or a graphical user interface is an example of providing information to an operator. The receiving of data through a touch screen, keyboard, mouse, trackball, touchpad, pointing stick, graphics tablet, joystick, gamepad, webcam, headset, gear sticks, steering wheel, wired glove, wireless remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bistable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Initially, it is pointed out that to design, characterize, and troubleshoot devices and systems (e.g. a device under test (DUT)), engineers need to measure a variety of characteristics of the device signals. To make such measurements, engineers generally use a network analyzer or oscilloscope, a data acquisition (DAQ) instrument, digital multimeter (DMM), etc. and an associated probing system and display.

Figure 2:
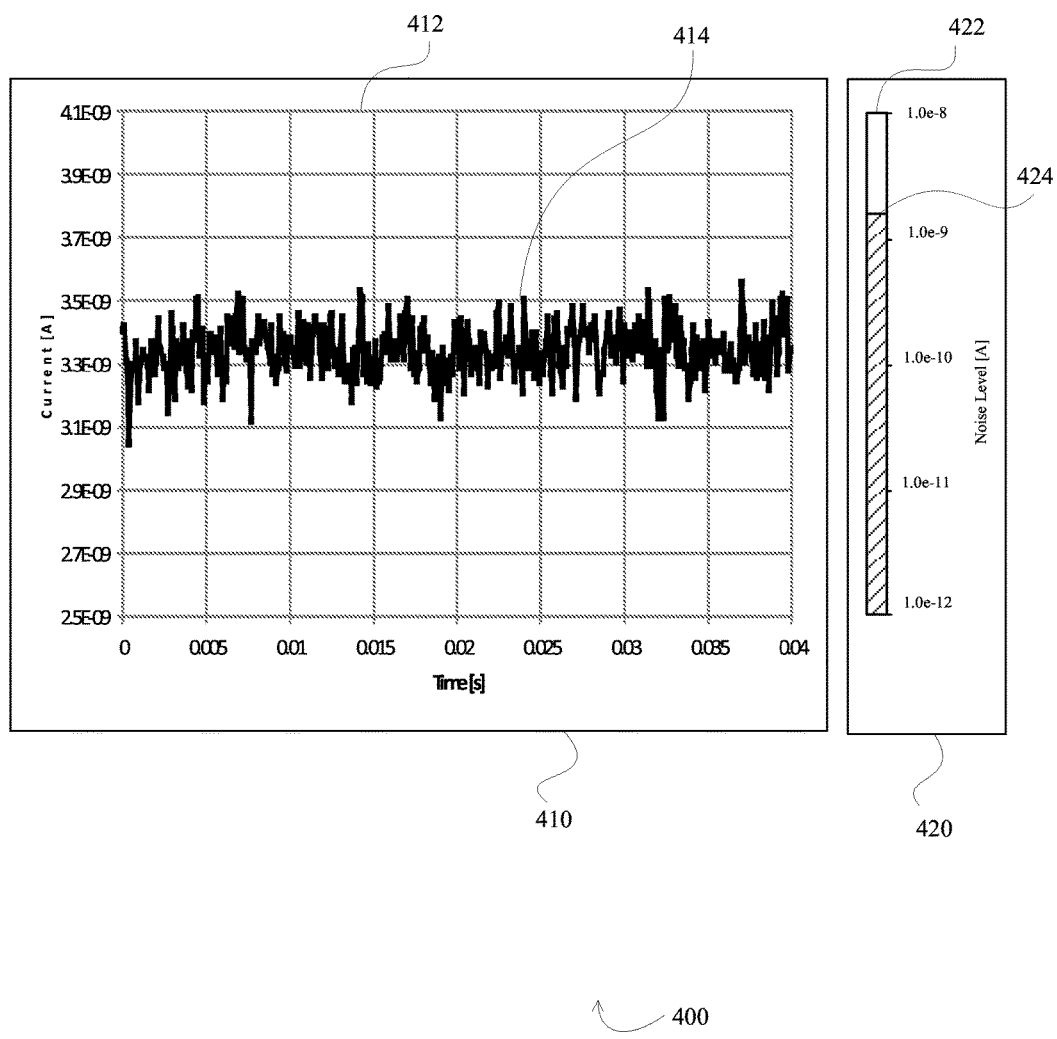
FIG. 2 illustrates a display screen on a display unit according to the first embodiment of the measuring apparatus.
Figure 3:
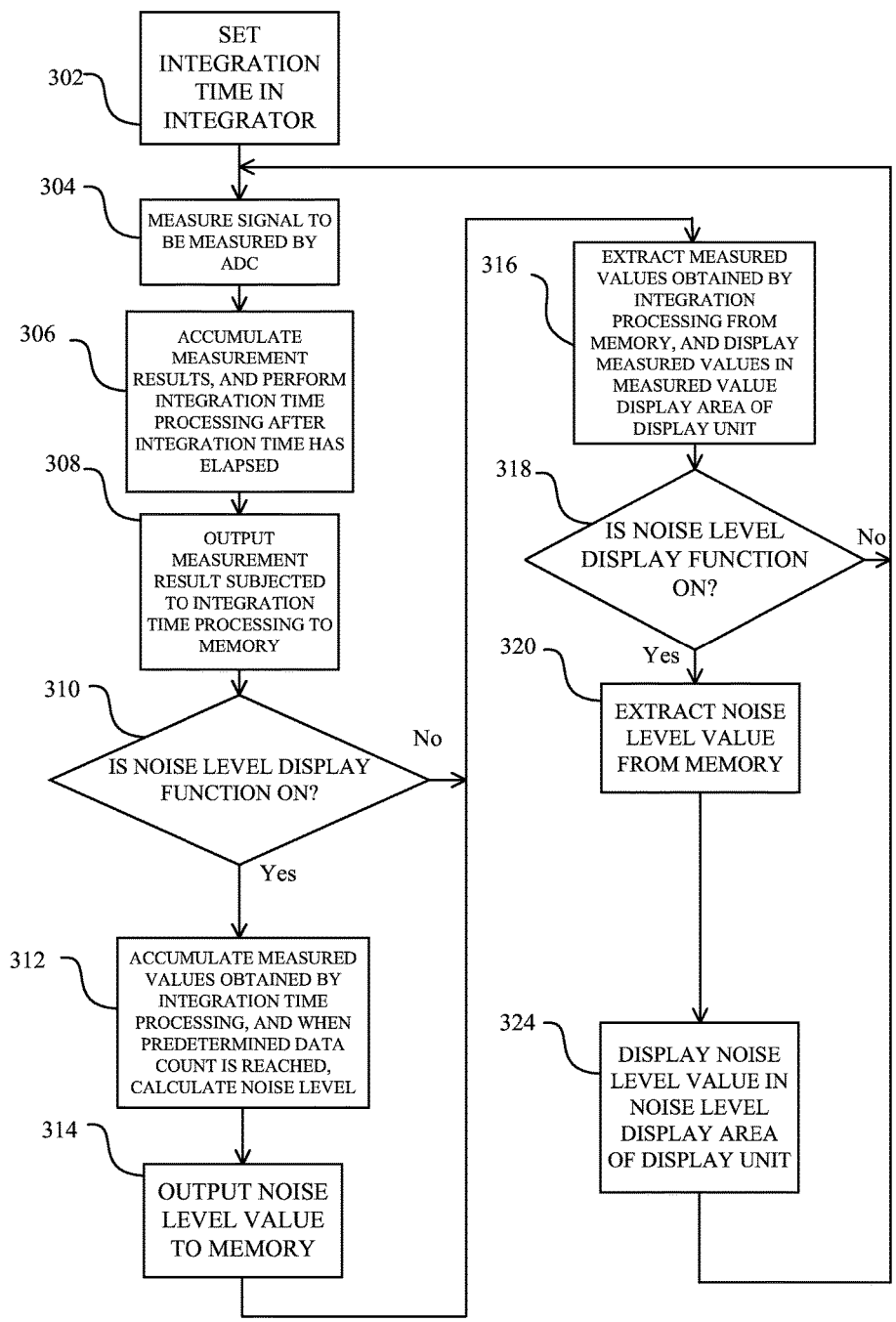
FIG. 3 is a flowchart illustrating an operation according to the first embodiment of the measuring apparatus.

Referring initially to FIGS. 1-3, a representative embodiment of a measuring apparatus 100 according to the present inventive features will be described.

In FIG. 1, a measuring apparatus 100 according to the first embodiment includes a measurement unit 106 for measuring a signal 102 to be measured and outputting a measurement result subjected to integration time processing based on a set integration time. A noise level calculation unit 116 is for calculating a noise level of the measurement result based on the measurement result output from the measurement unit 106 and outputting the noise level to a memory 110. The memory 110 is for storing data on the measurement result and the noise level that has been output from the measurement unit 106 and the noise level calculation unit 116, and a display unit 112 is for displaying the data stored in the memory 110.

The measurement unit 106 includes an A/D converter (ADC) 104 and an integrator 108. The ADC 104 samples and A/D-converts the signal 102 to be measured, and then outputs the results. The integrator 108 subjects an A/D conversion result thereof to the integration time processing based on a given integration time 114, and outputs a measured value obtained by the integration time processing. The integration time 114 is a value input or set by a user or a predetermined initially set value.

As the integration time processing, the integrator 108 may calculate an average of A/D conversion results over the integration time.

As processing performed by the noise level calculation unit 116, statistical calculation processing may be performed in the first embodiment. In more detail, the noise level calculation unit 116 obtains a variance of data (obtained as a root of mean square of differences between each one of data and the average) as the noise level. Here, various known methods can be used to obtain the variance of data.

Note that the integrator 108 and the noise level calculation unit 116 can be configured as part of a Field Programmable Gate Array (FPGA) including a register and an arithmetic operation unit. The display unit 112 can include a processor that operates by referring to the memory 110.

FIG. 2 illustrates a display screen 400 displayed by the display unit 112 of the measuring apparatus 100 by taking a micro-current measurement as an example.

Of the display screen 400, a measured value display area 410 illustrates measurement results 414 of the current as a graph 412 having a current value as the Y-axis and a lapse of time as the X-axis. A noise level display area 420 illustrates a variance relating to the current value obtained at a predetermined time point within the measured value display area 410 (for example, current value obtained last by measurement) as a noise level 424 in a bar chart 422.

Here, the Y-axis of the graph 412 is a linear scale indicating 2.5e-9 to 4.1e-9 [A], and the Y-axis of the bar chart 422 is a logarithmic scale indicating 1.0e-12 to 1.0e-8 [A].

FIG. 2 illustrates an example in which the measured values of a current after the integration time processing based on the assumption that the integration time is 100 μs are displayed as 400 points from t=0 [s] to 0.399 [s] in the measured value display area 410, and a variance 1.593e-9 [A] of data in those 400 points at t=−0.399 [s] is displayed in the noise level display area 420 as the noise level 424.

Note that in regard to display scales of the Y-axis of the measured value display area 410 and the Y-axis of the noise level display area 420, the Y-axis of the measured value display area 410 can be set as a logarithmic scale, and the Y-axis of the noise level display area 420 can be set as a linear scale.

In addition, the display scales of the Y-axis of the measured value display area 410 and the Y-axis of the noise level display area 420 can be both set as a linear scale or can be both set as a logarithmic scale. Furthermore, the Y-axis of the measured value display area 410 and the Y-axis of the noise level display area 420 can be set to have a common scale.

Next, a flowchart 300 illustrating an operation of the measuring apparatus 100 is described with reference to FIG. 3.

First, in Step 302, the integration time is set in the integrator 108. This setting can be performed on the measuring apparatus 100 by the user. Furthermore, this setting can be performed by reading an initial setting value held within the measuring apparatus 100.

Subsequently, in Step 304, a signal to be measured that has been input to the measuring apparatus 100 is measured by the ADC 104. Here, the signal to be measured can be set as a current, a voltage, or a physical quantity of another object to be measured.

Subsequently, in Step 306, the integrator 108 accumulates the measurement results from the ADC 104, performs the integration time processing after the above-mentioned integration time has elapsed, and obtains the measurement result subjected to the integration time processing.

Subsequently, in Step 308, the integrator 108 outputs the measurement result subjected to the integration time processing, which is obtained in Step 306, to the memory 110.

In addition, in Step 310, the noise level calculation unit 116 determines which of ON and OFF a noise level display function of the measuring apparatus 100 is set, and advances to Step 312 in a case of ON, while advancing to Step 316 in a case of OFF. So, it may be understood that when the noise level display function is set to ON, the method proceeds to the calculation of such noise level in the following step 312.

As such, in Step 312, the noise level calculation unit 116 accumulates the measurement results subject to the integration time processing, that is, the measured values, and when a predetermined data count is reached, calculates the noise level of the accumulated measured values to obtain a noise level value. Note that it may be preferred that the calculation of the noise level be performed by the calculation of the variance of data based on a statistical calculation.

Subsequently, in Step 314, the noise level calculation unit 116 outputs the noise level value obtained in Step 312 to the memory 110.

Subsequently, in Step 316, the display unit 112 extracts the measured value obtained by the integration time processing from the memory 110, which is displayed as a graph in the measured value display area 410 of the display unit 112. Note that when the noise level display function is OFF in Step 310, Step 316 is executed thereafter.

In addition, in Step 318, the display unit 112 determines which of ON and OFF the noise level display function of the measuring apparatus 100 is set, and advances to Step 320 in the case of ON, while returning to Step 304 to repeat execution of a series of steps in the case of OFF.

Subsequently, in Step 320, the display unit 112 extracts the noise level value from the memory 110.

Subsequently, in Step 324, the display unit 112 displays the extracted noise level value in the noise level display area 420, and returns to Step 304 to repeat the execution of the series of steps.

As described above, in the measuring apparatus 100 according to the first embodiment, after the signal to be measured has been measured, the measured value is displayed as a graph, and noise level display is further performed as necessary. That is, noise can be displayed while being measured successively based on the present measurement condition (integration time). Therefore, the user compares the display of the measured value with the noise level display, to thereby determine whether or not the present integration time is set short, or whether or not an influence of noise included in the measured value is sufficiently small even when the present integration time is further shortened, which can be useful to determine a more appropriate integration time.

Furthermore, the user can understand that it may be necessary to take a countermeasure, such as appropriately setting an integration time or appropriately selecting a measuring range, because the signal to be measured is greatly subject to the influence of noise based on the present measurement condition when the measured value is lower than the noise level.

As can be understood from the description made above, the user is free to select the integration time, and the measurement can be performed faster based on a shorter integration time. However, the noise tends to relatively increase based on too short an integration time, and hence it is necessary to select an appropriate integration time. Therefore, the present embodiments can provide a function of support therefore.

In particular, in the present embodiments, a sampling measurement may be performed (measurement is performed repeatedly at fixed time intervals) based on the integration time selected by the user, and a statistical calculation (a calculation of a variance) can be performed to calculate the noise level. This can be performed by using a result of an original current measurement. Here, the variance, which is known and defined as one of statistical values, is an amount indicating variations from an expected value. When it is clear that fluctuations in the signal to be measured under measurement can be ignored, the signal to be measured is equal to the expected value, and a result obtained as the variance can be regarded mainly as information on the noise. Therefore, according to the present embodiments, it may be preferred that the value of this variance be displayed as the noise level. The user can select an appropriate integration time by using the information relating to the noise level. For example, the user may select such an integration time that the noise level value to be displayed becomes equal to or less than a desired value, after which an original measurement may be started.

Regarding a bandwidth of a signal observed in a noise level variance measurement, the lowest frequency may be determined based on a sampling point count (measurement time), and the highest frequency may be determined based on the integration time for each point. Incidentally, in general, noise that causes the most serious problem in practical use is generated by an AC power supply, and a frequency thereof is 50 Hz or 60 Hz. Therefore, it is common to set the integration time sufficiently longer than a cycle of a power supply frequency so that the noise can be observed. According to the present embodiments, it may be possible to easily verify and understand the meaning of setting the integration time to, for example, 200 ms that is ten times as long as a cycle of 20 ms for 50 Hz.

Figure 4A:
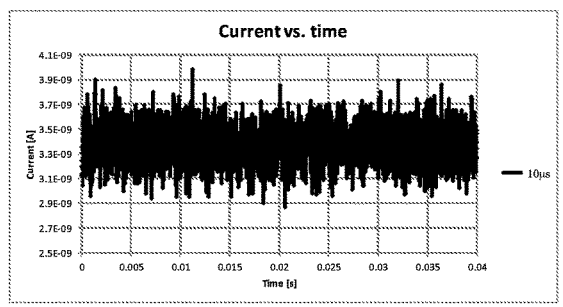
FIG. 4A is a graph showing an example of a signal measurement when an integration time is 10 μs.
Figure 4C:
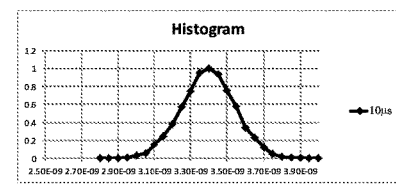
FIG. 4C is a histogram in which measurement results of FIG. 4A are normalized.
Figure 4B:
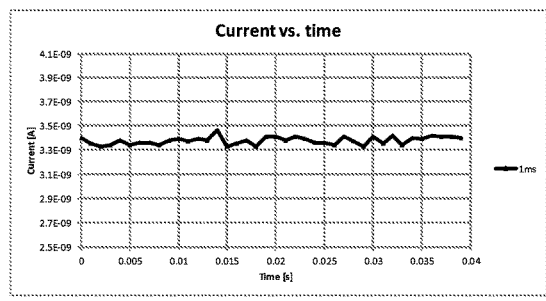
FIG. 4B is a graph showing an example of a signal measurement when an integration time is 1 ms.
Figure 4D:
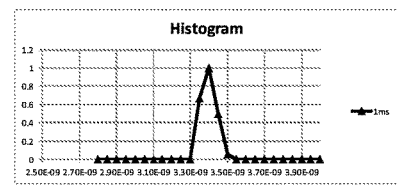
FIG. 4D is a histogram in which measurement results of FIG. 4B are normalized.

FIGS. 4A to 4D illustrate an effect or an advantage produced by the present embodiments. FIG. 4A illustrates an example of the measurement results of the signal to be measured in a case in which the integration time is 10 μs, and FIG. 4B illustrates an example of the measurement results of the same signal to be measured as that of FIG. 4A in a case in which the integration time is 1 ms. FIG. 4C illustrates a distribution normalized as a histogram of the measurement results of FIG. 4A with the most frequent data count set to 1, and FIG. 4D illustrates a distribution normalized as a histogram of the measurement results of FIG. 4B in the same manner as in FIG. 4C. It is possible to intuitively understand that, from a comparison between FIG. 4A and FIG. 4B, the measured value is stabilized by appropriately setting the integration time long, and that, from a comparison between FIG. 4C and FIG. 4D, the variance of the measured values becomes smaller by setting a longer integration time.

In a case of using the value of the variance for the calculation of the noise level as a preferred case of the first embodiment, the integration time processing for the measured value and the calculation of the variance can be configured by an accumulator and an arithmetic unit for performing a simple arithmetic operation, which simplifies a circuit and also eliminates the need for high CPU calculation performance. In addition, a large-volume data storage area is not required. Therefore, the first embodiment can also be easily implemented in a compact electronic measuring instrument.

Figure 9:
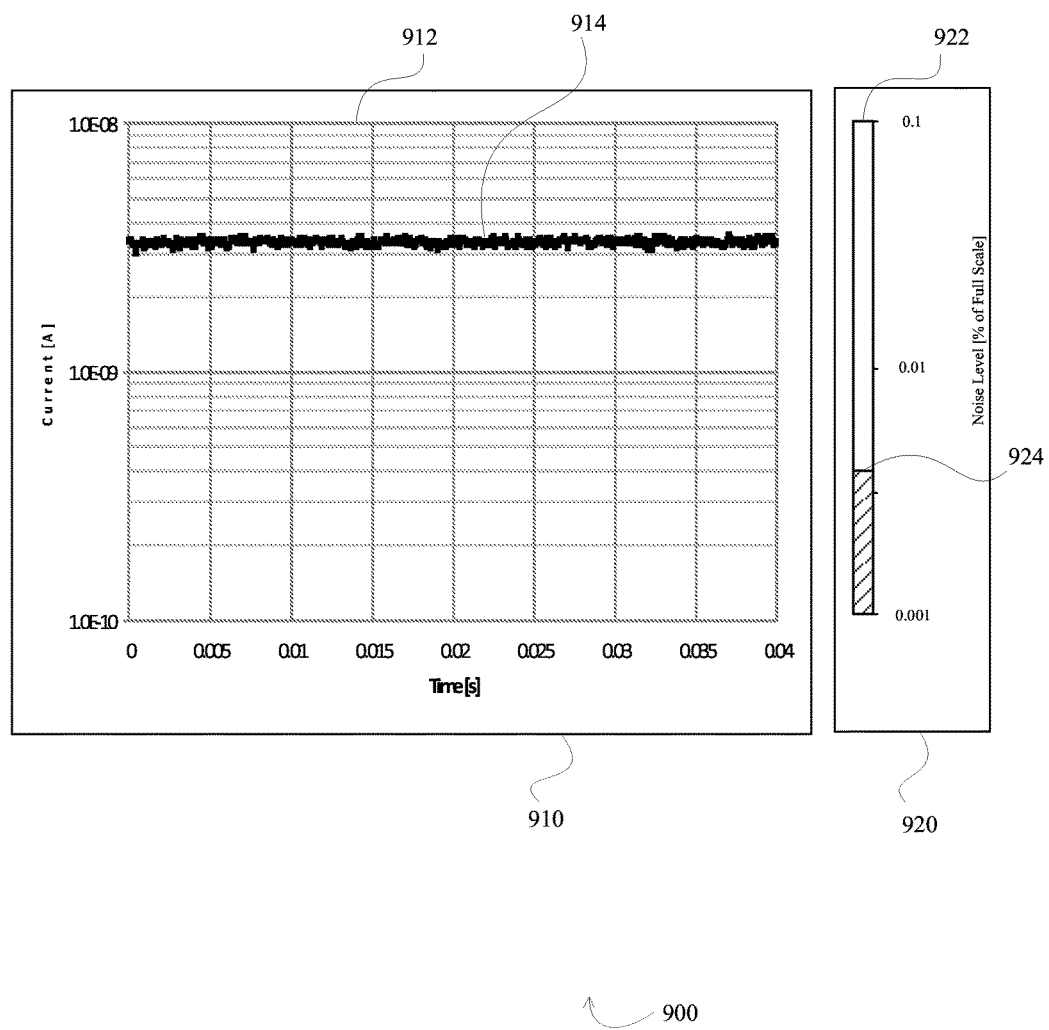
FIG. 9 illustrates a display screen on a display unit according to another embodiment of the measuring apparatus.
Figure 10:
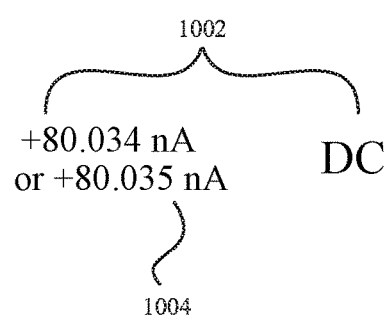
FIG. 10 illustrates a display screen for a measurement result according to the related art.

In the first embodiment, in FIG. 2, the scale of the bar chart 422 of the noise level display area 420 is set as the same scale unit as that of the Y-axis of the measured value display area 410. In other words, both display areas 410 and 420 use Amperes as the scale unit. In a second embodiment of the present approach, as illustrated in FIG. 9 as a display screen 900, the scale of a bar chart 922 of a noise level display area 920 is set as a logarithmic indication (924) indicating a percentage relative to a full scale of the measuring range (±20 μA) of a measured value display area 910. By employing the display of the noise level according to the second embodiment, the user can intuitively read the percentage of the noise being observed relative to the full scale of the measuring range being used by the noise level.

In addition, it is possible to easily determine the noise level by viewing the display of the noise level display area 920 even when the noise level desired by the user is to be suppressed to a lower level by a certain decade relative to the full scale of the measuring range.

Note that a step of converting the noise level value extracted from the memory 110 into the logarithmic indication 924 to be displayed in the bar chart 922 can be executed in Step 324 by the display unit 112 illustrated in FIG. 1 in the second embodiment.

Note that the measured value display area 910 of the display screen 900 can be displayed in the same manner as in the measured value display area 410 according to the first embodiment, but here, a graph 912 for displaying a measurement result 914 of the current is displayed by using the logarithmic indication of the current value as the Y-axis.

Furthermore, the display scales of the Y-axis of the measured value display area 910 and the Y-axis of the noise level display area 920 are set as a common logarithmic scale in FIG. 9, but as described above with reference to FIG. 2, can be set separately as a linear scale or a logarithmic scale.

According to a third embodiment of the present approach, the noise level can be obtained by causing the noise level calculation unit 116 to execute a frequency analysis method such as a Fourier transform or a wavelet transform in the first embodiment.

With this configuration, it is also possible to stably perform the calculation of the noise level when the signal to be measured is modulated.

According to the first embodiment, it is possible to know a proportion of the noise level in the measured value in a case of a given integration time. However, the user may need to try measurements based on various values of integration times in order to select an optimum value from among the various values of integration times.

Figure 5A:
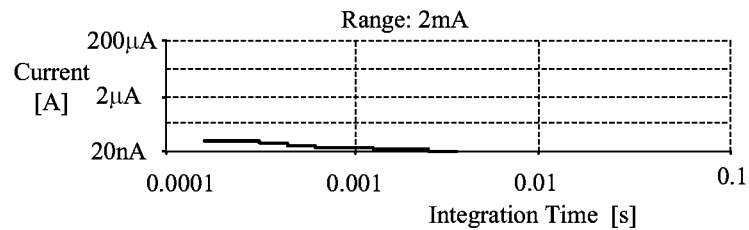
FIG. 5A is a graph showing a frequency distribution of a noise level of a given signal to be measured within a 2-mA range.
Figure 5B:
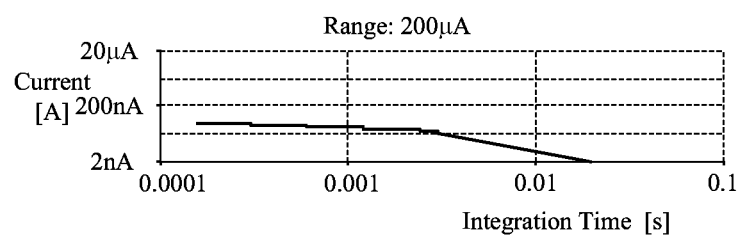
FIG. 5B is a graph showing a frequency distribution of the noise level of the given signal to be measured within a 200-μA range.
Figure 5C:
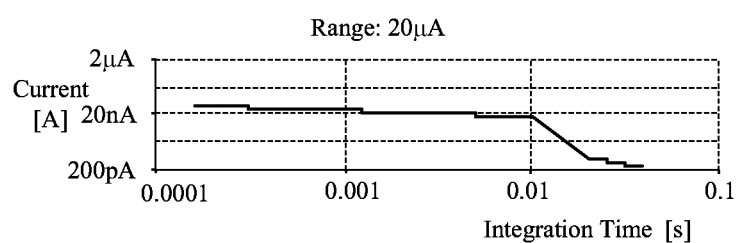
FIG. 5C is a graph showing a frequency distribution of the noise level of the given signal to be measured within a 20-μA range.
Figure 5D:
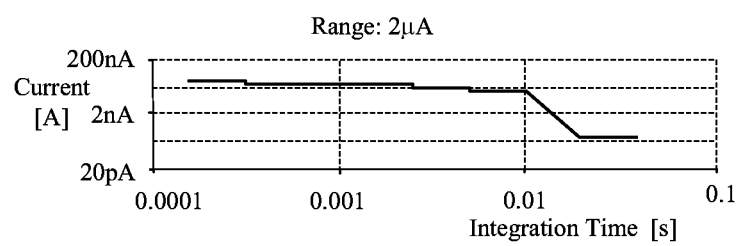
FIG. 5D is a graph showing a frequency distribution of the noise level of the given signal to be measured within a 2-μA range.

Therefore, FIGS. 5A to 5D show frequency distributions of the noise level obtained as a result of measuring the noise level of a given signal to be measured based on various values of integration times and various measuring ranges according to the first embodiment. Here, FIG. 5A shows the noise level obtained when the integration time is changed for a plurality of values within a predetermined range (0.00005 s to 0.04 s) within a 2-mA range, FIG. 5B shows the noise level of the same signal to be measured as that of FIG. 5A obtained when the integration time is changed within a 200-μA range in the same manner as in FIG. 5A, FIG. 5C shows the noise level of the same signal to be measured as that of FIG. 5A obtained when the integration time is changed within a 20-μA range in the same manner as in FIG. 5A, and FIG. 5D shows the noise level of the same signal to be measured as that of FIG. 5A obtained when the integration time is changed within a 2-μA range in the same manner as in FIG. 5A. Note that a power line has a frequency of 50 Hz at this time. Note that the noise level is obtained by the calculation of the variance.

As can be read from FIGS. 5A to 5D, in a case in which the measuring range is equal to or less than 20 μA, when the integration time is 0.02 s, that is, equal to or more than 20 ms, the noise level exhibits a small change, whereas in a case in which the measuring range is equal to or more than 200 μA, when the integration time is equal to or more than 0.02 s, the noise level is equal to or less than 2 nA. Therefore, it can be understood that it is desired to set the integration time to equal to or more than 1 PLC or 20 ms. Note that the noise level shown in FIGS. 5A to 5D is generally between 2 nA to 200 nA (e.g. about 20 nA) within any of the ranges.

Therefore, by use of the fact that the integration time determines an upper limit to an observation frequency, it is possible to examine the frequency distribution of the noise by repeatedly calculating the noise level while changing the integration time. Note that, in this case, the measurement time is fixed, and hence a lower limit to the observation frequency is not changed.

Here, the noise within a wide frequency range is observed when the integration time is short, while noise within a narrow (low) frequency range is observed when the integration time is long.

In each of FIGS. 5A to 5D, the integration time in the X-axis becomes shorter, that is, a wider bandwidth in a position closer to the left edge, and a narrower bandwidth in a position closer to the right edge.

In particular, when the graph of FIG. 5D is focused, it is understood that the noise, which is greater in a position of the integration time shorter than 0.01 s, is abruptly reduced across 0.01 s. This indicates that a large noise component exists at 50 Hz (20 ms) of the power supply frequency. When the graph of FIG. 5A is focused in turn, such a large change as in FIG. 5D is not observed in this graph, and the noise level gradually decreases from the left to the right. This indicates that there is no large noise that blocks/hides measurement current existing in 2-mA range.

Therefore, this fourth embodiment of the present approach provides an apparatus for changing or sweeping the integration time over a predetermined range and displaying the distribution of the noise level.

Figure 6:
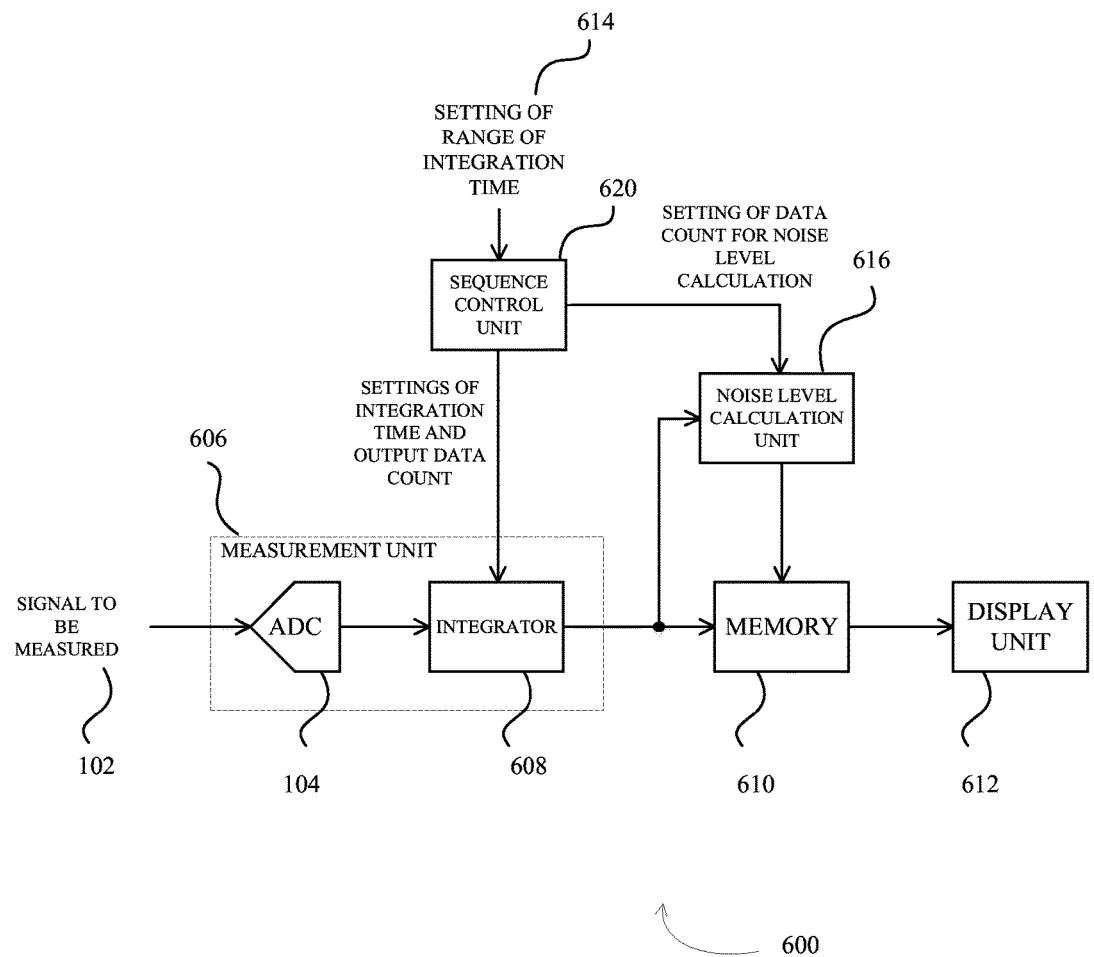
FIG. 6 is a block diagram of a measuring apparatus in accordance with features of another embodiment.

In FIG. 6, a measuring apparatus 600 according to the fourth embodiment includes a measurement unit 606 for measuring the signal 102 to be measured and outputting the measurement result subjected to the integration time processing based on the set integration time under control of a sequence control unit 620, a noise level calculation unit 616 for performing noise level calculation processing based on the measurement result output from the measurement unit 606, calculating the noise level of the measurement result, and outputting the noise level to a memory 610, the memory 610 for storing data on the measurement result and the noise level that have been output from the measurement unit 606 and the noise level calculation unit 616, and a display unit 612 for displaying the data stored in the memory 610.

The measurement unit 606 includes the ADC 104 and an integrator 608. The ADC 104 samples and A/D-converts the signal 102 to be measured, and then outputs the results. The integrator 608 performs the integration time processing for the A/D conversion result based on settings of the integration time and an output data count that have been supplied from the sequence control unit 620, and outputs the measured value obtained by the integration time processing. The sequence control unit 620 receives the integration time 614, which is the value input or set by the user or the predetermined initially set value, and outputs the integration time and the output data count, which are necessary for a series of operations, to the integrator 608.

Based on the data count for noise level calculation set by the sequence control unit 620, the noise level calculation unit 616 receives the measurement result subjected to the integration time processing for a predetermined data count from the integrator 608, calculates the noise level of the measurement result, and outputs the noise level to the memory 610.

The sequence control unit 620 receives a setting 614 of the range of the integration time which has been set by the user or a setting 614 of the range of the integration time which is a predetermined initial state, and causes the integrator 608 and the noise level calculation unit 616 to operate by supplying necessary control data such as the integration time and a data point count thereto, to thereby perform control so that the noise level value obtained by sweeping the integration time for a plurality of values within a predetermined range is output to the memory 610.

The integration time processing of the integrator 608 and the processing of the noise level calculation unit 616 are the same as those of the first embodiment, except that received parameters are different.

The display unit 612 reads the noise level and the measured value obtained by the integration time processing from the memory 610, and displays the noise level and the measured value.

Here, it is preferred that the calculation of the noise level according to the fourth embodiment can be performed by the calculation of the variance.

Note that the sequence control unit 620, the integrator 608, and the noise level calculation unit 616 can be configured as part of an FPGA including a register and an arithmetic operation unit. The display unit 612 can include a processor that operates by referring to the memory 610.

Figure 7:
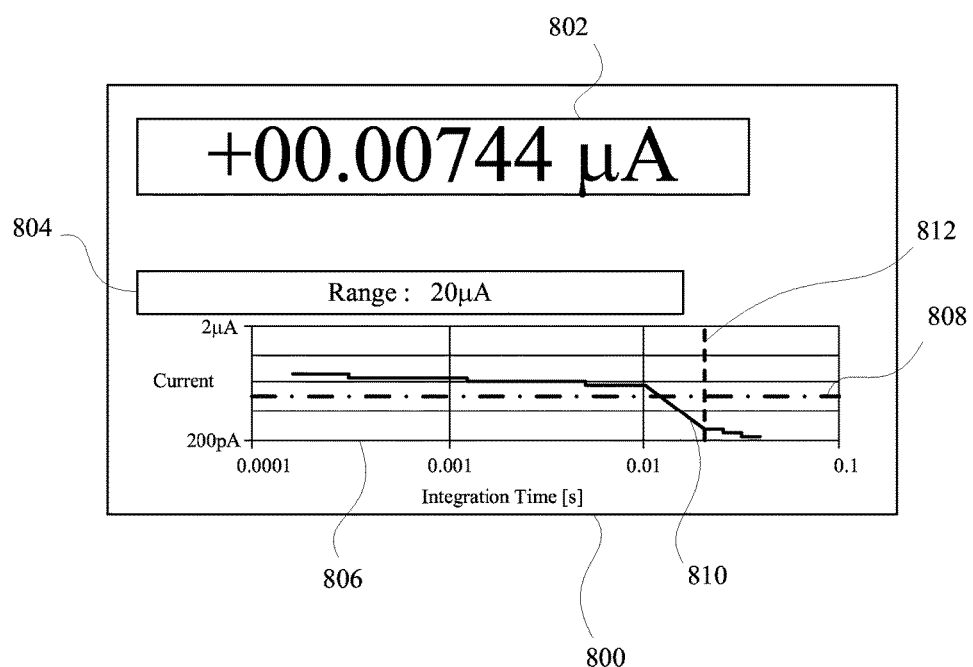
FIG. 7 illustrates a display screen on a display unit according to the embodiment of the measuring apparatus of FIG. 6.

Next, FIG. 7 illustrates a display screen 800 displayed by the display unit 612 of the measuring apparatus 600 by taking the micro-current measurement as an example.

Of the display screen 800, a digital display area 802 digitally displays the measured value (current value) obtained by the integration time processing. A range display area 804 displays the measuring range. A graph display area 806, in which the X-axis indicates the integration time [s] by the logarithmic scale and the Y-axis indicates the current [A] as the logarithmic scale, displays the frequency distribution obtained by connecting the noise levels among a plurality of values based on the integration times within a predetermined range as a graph 810 indicated by a solid line.

In addition, a vertical dotted line 812 is a marker for displaying the integration time set at present, and indicates that the integration time is set to 0.02 s at present.

In addition, a horizontal dashed line 808 displays the present measured value indicated in the digital display area 802 as a marker relative to the Y-axis, and can be read along with the graph 810 of the noise level. According to FIG. 7, it can be read that the value of the graph 810 of the noise level based on the present integration time (vertical dotted line 812) has room on the order of one digit compared to the measured value indicated by the horizontal dashed line 808, and that the noise exceeds the measured value when the integration time is further reduced to, for example, 0.01 s. In addition, it can be read that the noise is further reduced a little when the integration time is further increased to 0.03 s, to make room with respect to the measured value.

Note that a feature of a minute value can be effectively read from FIG. 7 because the display scale of the Y-axis of the graph display area 806 is a logarithmic scale.

Note that the example in which the X-axis and the Y-axis of the graph display area 806 illustrated in FIG. 7 are both set as a logarithmic scale is described, but a variation with either or both thereof as a linear scale is also contemplated.

Figure 8:
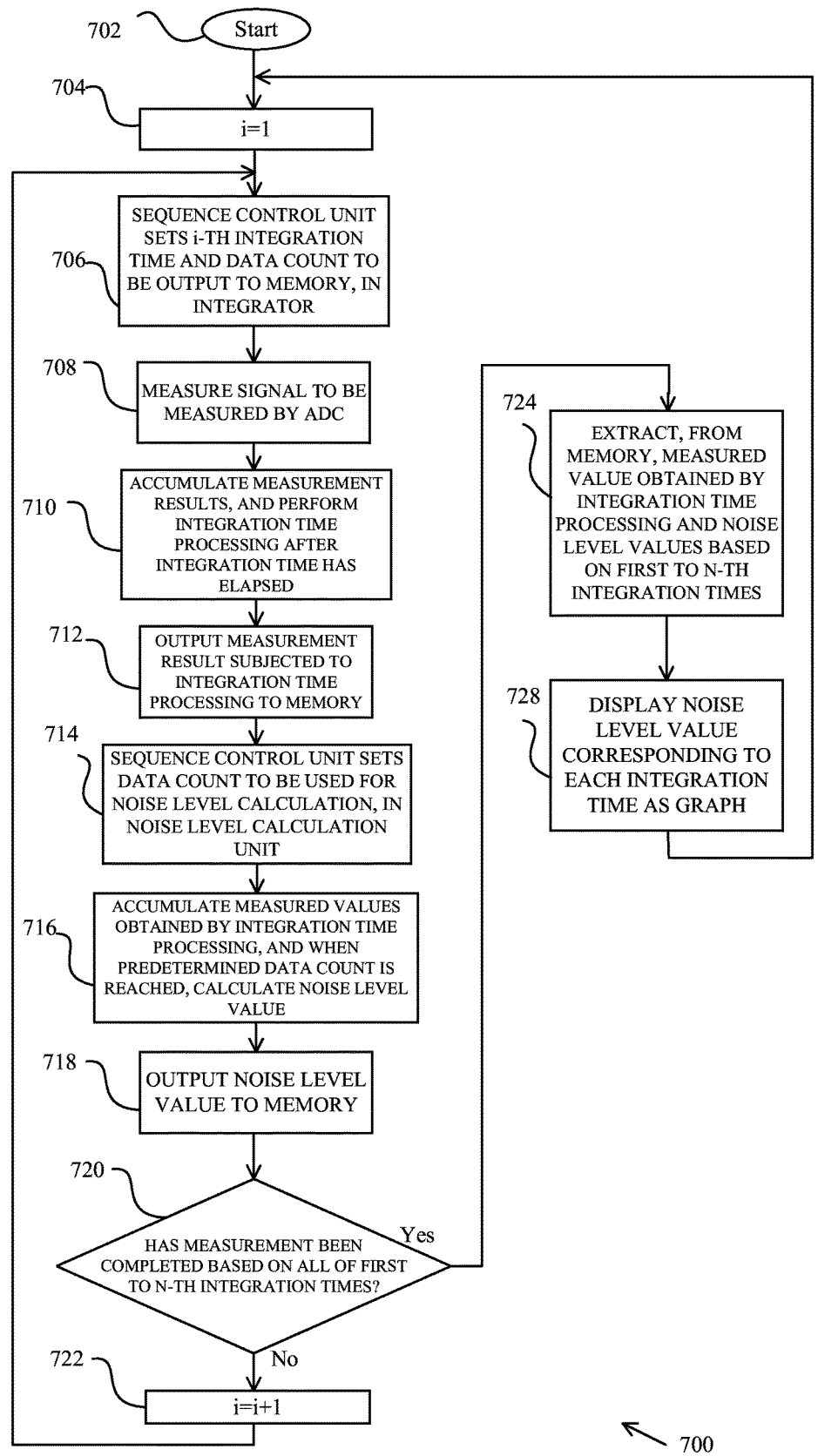
FIG. 8 is a flowchart illustrating an operation according to the embodiment of the measuring apparatus of FIG. 6.

Next, a flowchart 700 of an operation of the measuring apparatus 600 is described with reference to FIG. 8.

First, the operation is started in Step 702, and in Step 704, a variable i for counting the number of the integration time is initialized to one.

In Step 706, the sequence control unit 620 sets an i-th integration time and the data count to be output to the memory 610, in the integrator 608.

Subsequently, in Step 708, the signal 102 to be measured is measured by the ADC 104.

Subsequently, in Step 710, the integrator 608 accumulates the measurement result from the ADC 104, and performs the integration time processing after the integration time has elapsed based on the integration time supplied from the sequence control unit 620.

Subsequently, in Step 712, the integrator 608 outputs the measurement result subjected to the integration time processing to the memory 610.

Subsequently, in Step 714, the sequence control unit 620 sets the data count to be used for the noise level calculation, in the noise level calculation unit 616.

Subsequently, in Step 716, the noise level calculation unit 616 accumulates the measured values obtained by the integration time processing, and when a predetermined data count is reached, calculates the noise level value.

Subsequently, in Step 718, the noise level calculation unit 616 outputs the noise level value to the memory 610.

Subsequently, in Step 720, the measurement unit 606 is controlled by the sequence control unit 620 to determine whether or not the measurement has been completed based on all of the first to N-th integration times, and when the measurement has not been completed, the procedure advances to Step 722, while the procedure advances to Step 724 when the measurement has been completed.

In Step 722, the variable i is incremented, and the procedure returns to Step 706 to repeat the processing.

In Step 724, the display unit 612 extracts, from the memory 610, the measured value obtained by the integration time processing and the noise level values based on the first to N-th integration times.

Subsequently, in Step 728, the display unit 612 displays the measured value obtained by the integration time processing and the noise level value corresponding to each integration time on the display screen 800, and the procedure returns to Step 704 to repeat the processing.

As described above, with the measuring apparatus 600 according to the fourth embodiment, after the signal to be measured is measured, the noise level corresponding to the measured value of a plurality of integration times within a predetermined range (that is, first to N-th integration times) and the last measured value are displayed on the display screen. Therefore, the user can examine the frequency distribution of the noise level within the present range, to thereby easily determine the optimum integration time based on the frequency distribution of the noise level.

It is preferred in the fourth embodiment that the noise level be calculated by calculating the variance of the measured value, to thereby obtain the frequency distribution of the noise level. Therefore, the circuit is simpler than in a case of using the Fourier transform, and the need for high CPU calculation performance is eliminated as well. In addition, a large-volume data transfer is not required. Therefore, the fourth embodiment can also be easily implemented in a compact electronic measuring instrument.

A fifth embodiment of the present approach is configured so that, on the display screen illustrated in FIG. 7, the user is allowed to easily recognize a varying digit of the value digitally displayed in the digital display area 802 by highlighting the varying digit. The above-mentioned fifth embodiment can be configured to execute the processing in Step 728 of FIG. 8 on the display unit 612 illustrated in FIG. 6.

According to a sixth embodiment of the present approach, the noise level can be obtained by causing the noise level calculation unit 616 to execute the frequency analysis method such as a Fourier transform or a wavelet transform in the fourth embodiment. With this configuration, it is also possible to stably perform the calculation of the noise level when the signal to be measured is modulated.

Figure 11:
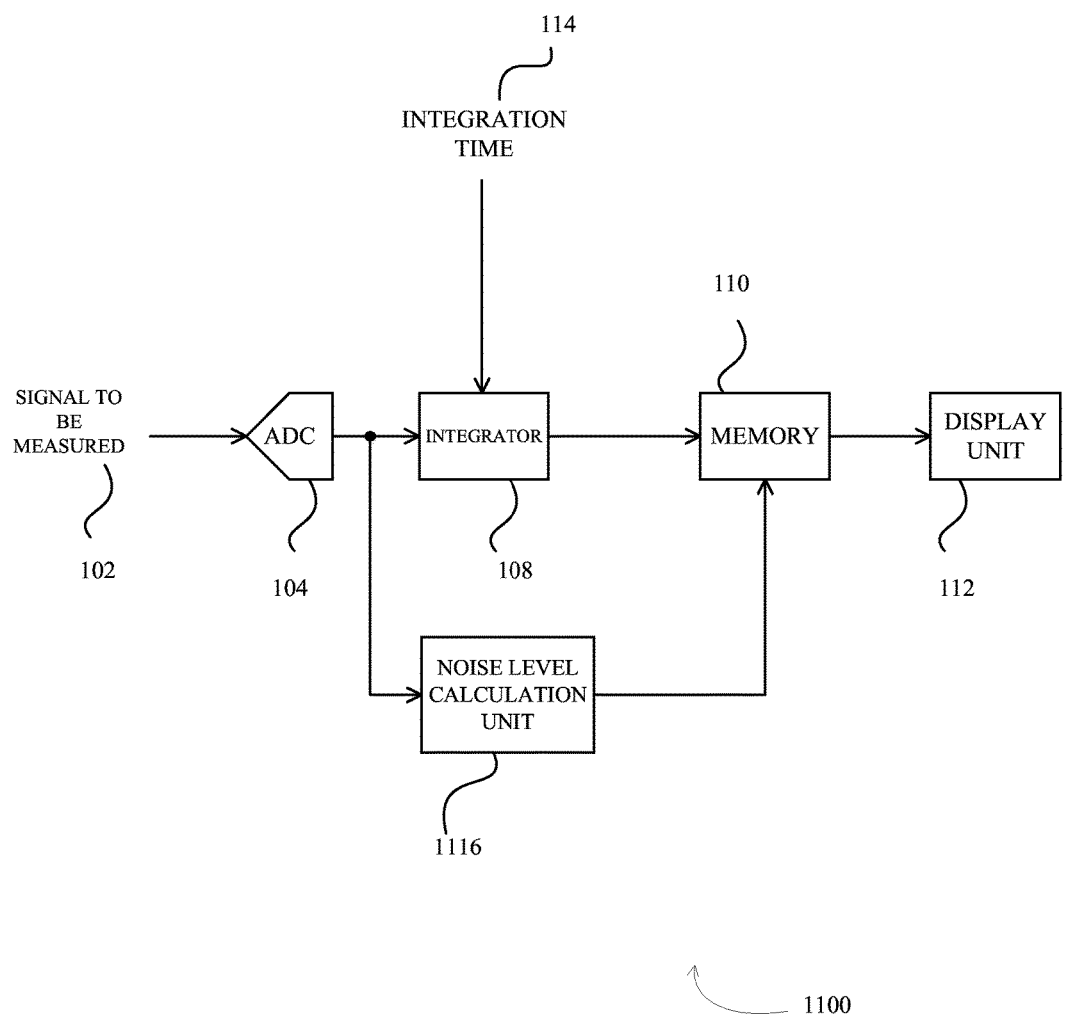
FIG. 11 is a block diagram of another embodiment of the measuring apparatus.

A seventh embodiment of the present approach is an embodiment including, as illustrated in FIG. 11, a noise level calculation unit 1116 in place of the noise level calculation unit 116 in the first embodiment, to thereby receive an A/D conversion result from the ADC 104, calculate the noise level of the signal 102 to be measured based on the A/D conversion result, and store the noise level value in the memory 110.

Here, in consideration of the integrator 108 according to the first embodiment functioning as a low pass filter for adjusting the bandwidth of the signal 102 to be measured, as in the seventh embodiment, the noise level can be obtained even by this method of calculating the noise level directly from the A/D conversion result from the signal 102 to be measured.

Note that the noise level calculation unit 1116 can execute the frequency analysis method such as a Fourier transform or a wavelet transform.

Here, the noise level calculation unit 1116 is executed in parallel with the integration time processing performed by the integrator 108, and hence an increase in speed can be expected due to the parallel processing.

An eighth embodiment of the present approach can be an embodiment obtained by combining the features of the seventh embodiment with the fourth embodiment.

Note that each of the above-mentioned embodiments is not limited to the measurement of the current or the voltage of a micro-signal and can be applied to the measurement of various general physical quantities.

In view of the embodiments set forth above, in the present approach, a user can know the state of the noise at all times, and hence, it is possible to quickly determine an appropriate measurement condition without undertaking a process of trial and error and to perform effective measurement.

According to the fourth to sixth embodiments, noise information is calculated and displayed at all times, and hence, an environment for the measurement and a status thereof can be grasped as the numerical value. Therefore, it is possible to instantaneously know that a measuring system is in a different state from a usual state due to an occurrence of some abnormality therein (for example, occurrence of new noise source).

By causing an optimum measurement condition to be automatically selected from the noise information obtained here or to be presented to a person who is performing the measurement, it is possible to appropriately perform the measurement with efficiency even without expert skills. For example, a correspondence table created in advance or conversion using a mathematical expression can be used as a method of obtaining the measurement condition from the noise information.

The present embodiments can be applied to a micro-voltage measurement as well as the micro-current measurement. Alternatively, the present embodiments can be applied to such other measuring apparatus for which an S/N ratio matters.

The present embodiments can also be used as an indication of whether or not the signal is buried in the noise level and adversely affected thereby in a real-time measurement of a general physical quantity using the integration time.

Various calculation methods such as a statistical analysis method can be selected as a method of calculating the noise level in addition to the frequency analysis method.

In the first, second, fourth, and fifth embodiments, a complicated arithmetic operation such as a Fourier transform is not necessary when a variance calculation is used as the calculation of the noise level, which simplifies the circuit and also eliminates the need for the high CPU calculation performance. In addition, a large-volume data storage area or a large-volume data transfer is not required, and the display of the noise level can also be easily implemented in a compact electronic measuring instrument.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems, for example, as discussed above.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A measuring apparatus for electrical signals, the measuring apparatus comprising:
   an analog-to-digital (A/D) converter configured to A/D-convert an analog signal to be measured;
   an integrator configured to: receive A/D conversion results from the A/D converter; to perform integration time processing to determine an average of the A/D conversion results over a predetermined integration time; and to output a plurality of measured values obtained by integration time processing;
   a noise level calculation unit configured to calculate a noise level of the analog signal to be measured from the plurality of measured values obtained by the integration time processing;
   a display unit configured to display noise levels corresponding to a plurality of integration times;
   a sequence control unit configured to supply the integrator with the predetermined integration time, supply the noise level calculation unit with a data count for calculation, and control the calculation of noise levels corresponding to the plurality of integration times; and
   a memory configured to store data output from the integrator and the noise level calculation unit, and to output the data to the display unit.

2. The measuring apparatus according to claim 1, wherein the noise level calculation unit is configured to perform a statistical calculation for the plurality of measured values obtained by the integration time processing.

3. The measuring apparatus according to claim 1, wherein the noise level calculation unit is configured to calculate a variance of the plurality of measured values obtained by the integration time processing, and set the variance as the noise level.

4. The measuring apparatus according to claim 3, wherein the display unit is configured to display the noise levels corresponding to the plurality of integration times as a graph display, and display the noise levels of the graph display logarithmically.

5. The measuring apparatus according to claim 3, wherein the display unit is configured to display the noise levels corresponding to the plurality of integration times as a graph display, and display the integration times of the graph display logarithmically.

6. The measuring apparatus according to of claim 1, wherein the display unit is further configured to display a present measured value obtained by the integration time processing of the plurality of measured values obtained by the integration time processing.

7. The measuring apparatus according to claim 1, wherein the display unit is further configured to display a present integration time.

8. The measuring apparatus according to claim 1, wherein the display unit is configured to digitally display the measured values obtained by the integration time processing including a highlighted unstable digit.

9. A measuring apparatus for electrical signals, the measuring apparatus comprising:
   an analog-to-digital (A/D) converter configured to A/D-convert an analog signal to be measured;
   an integrator configured to: receive A/D conversion results from the A/D converter; to perform integration time processing to determine an average of the A/D conversion results over a predetermined integration time; and to output a plurality of measured values obtained by integration time processing;
   a noise level calculation unit configured to calculate a noise level of the analog signal to be measured from the plurality of measured values obtained by the integration time processing;
   a sequence control unit configured to supply the integrator with the predetermined integration time, supply the noise level calculation unit with a data count for calculation, and control the calculation of noise levels corresponding to the plurality of integration times;
   a memory configured to store data output from the integrator and the noise level calculation unit, and to output the data to the display unit, the display unit being configured to display the plurality of measured values obtained by the integration time processing and the noise level.

10. The measuring apparatus according to claim 9, further comprising a memory configured to store data output from the integrator and the noise level calculation unit, and provide the data to the display unit.

11. The measuring apparatus according to claim 9, wherein the noise level calculation unit is configured to calculate a variance of the plurality of measured values obtained by the integration time processing, and set the variance as the noise level.

12. The measuring apparatus according to claim 9, wherein the display unit is configured to display the plurality of measured values obtained by the integration time processing and the noise level in a graph using a logarithmic axis.

13. The measuring apparatus according to claim 9, wherein the display unit is configured to display the noise level by using a percentage relative to a full scale of a measuring range.

14. A method of measuring a noise level of an analog signal, the method comprising:
   analog-to-digital (A/D) converting the analog signal to generate a plurality of A/D conversion results;
   receiving the plurality of A/D conversion results from the A/D converter;

performing integration time processing to determine an average of the A/D conversion results over a predetermined integration time;

outputting a plurality of measured values obtained by integration time processing;

calculating a noise level of the analog signal from the plurality of measured values obtained by the integration time processing;

supplying predetermined integration time;

supplying a data count for calculation;

controlling the calculation of noise levels corresponding to a plurality of integration times;

storing data output from the integration time processing and the calculating of the noise level;

outputting the data to a display unit; and displaying the noise level and at least one of the plurality of measured values obtained by the integration time processing on a display unit.

15. The method of measuring a noise level according to claim 14, wherein calculating of the noise level comprises calculating a variance of the plurality of measured values obtained by the integration time processing to obtain the noise level.

16. The method of measuring a noise level according to claim 14, further comprising, supplying a plurality of integration times for the integration time processing; and obtaining the noise level corresponding to each of the plurality of integration times, wherein displaying the noise level and the at least one of the plurality of measured values obtained by the integration time processing comprises displaying the noise level corresponding to each of the plurality of integration times.

17. The method of measuring a noise level according to claim 14, wherein the noise levels corresponding to a plurality of integration times are displayed logarithmically as a graph display.

18. The method of measuring a noise level according to claim 14, wherein the noise levels corresponding to a plurality of integration times are displayed as a graph display, and the integration times of the graph display are displayed logarithmically.

19. The method of measuring a noise level according to claim 14, wherein displaying further comprises displaying a present measured value obtained by the integration time processing of the plurality of measured values obtained by the integration time processing.

* * * * *